United States Patent
Hammerschmidt et al.

(10) Patent No.: US 8,638,090 B2
(45) Date of Patent: *Jan. 28, 2014

(54) MAGNETIC SENSOR SYSTEM AND METHOD

(75) Inventors: Dirk Hammerschmidt, Villach (AT); Juergen Zimmer, Ottobrun (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/613,933

(22) Filed: Sep. 13, 2012

(65) Prior Publication Data

US 2013/0241537 A1      Sep. 19, 2013

Related U.S. Application Data

(63) Continuation of application No. 12/269,168, filed on Nov. 12, 2008, now Pat. No. 8,269,486.

(51) Int. Cl.
*G01R 33/06* (2006.01)

(52) U.S. Cl.
USPC .................. 324/207.21; 324/200; 324/207.25

(58) Field of Classification Search
None
See application file for complete search history.

(56) References Cited

U.S. PATENT DOCUMENTS

| | | | |
|---|---|---|---|
| 6,166,539 A | 12/2000 | Dahlberg et al. | |
| 6,501,271 B1 | 12/2002 | Lenssen et al. | |
| 6,633,462 B2 | 10/2003 | Adelerhof | |
| 6,640,652 B2 | 11/2003 | Kikuchi et al. | |
| 6,927,566 B2 | 8/2005 | Apel et al. | |
| 7,033,849 B2 | 4/2006 | Siegle et al. | |
| 7,405,560 B2 | 7/2008 | Shimizu et al. | |
| 7,417,421 B2 | 8/2008 | Wendt | |
| 7,965,077 B2 | 6/2011 | Engel et al. | |
| 8,269,486 B2 * | 9/2012 | Hammerschmidt et al. ................ | 324/207.21 |
| 2004/0239318 A1 | 12/2004 | Xiao et al. | |
| 2007/0063690 A1 | 3/2007 | De Wilde et al. | |
| 2007/0080683 A1 | 4/2007 | Bartos et al. | |
| 2008/0116886 A1 | 5/2008 | Yamada et al. | |

FOREIGN PATENT DOCUMENTS

| | | |
|---|---|---|
| DE | 10257253 | 2/2004 |
| DE | 102006043410 | 3/2008 |

OTHER PUBLICATIONS

S. Arana et al., "High Temperature Circular Position Sensor Based on a Giant Magnetoresistance Nanogranular", IEEE Sensors Journal, vol. 4, No. 2, Apr. 2004 (pp. 221-225).

(Continued)

*Primary Examiner* — Jermele M Hollington
*Assistant Examiner* — Trung Nguyen
(74) *Attorney, Agent, or Firm* — Dicke, Billig & Czaja, PLLC

(57) ABSTRACT

A sensor system method of production includes forming first and second structures of the magnetoresistive system, heating the first and second structures, applying a magnetic field in a reference direction to the first and second structures, and cooling the first and second structures to fix a reference magnetization in the first and second structures in the reference direction. The structures are heated to near or above a blocking temperature, whereby the shape anisotropy of the first structure forces the reference magnetization to rotate into a first new orientation and the shape anisotropy of the second structure forces the reference magnetization to rotate into a second new orientation whereby the reference magnetization in the first and second structures rotate in opposite directions. The rotated reference magnetizations of the first and second structures are pinned in the respective new orientation.

12 Claims, 5 Drawing Sheets

(56) References Cited

OTHER PUBLICATIONS

Elktronik 24/2007 "Magnetoresistiv hat Zukunft", pp. 50-60, 2007 (Translation attached).

English Translation of: Elktronik 24/2007 "Magnetoresistiv hat Zukunft", pp. 50-60, 2007.
Office Action in related U.S. Appl. No. 12/269,168 mailed Jun. 15, 2011.

* cited by examiner

MAGNETIC SENSOR SYSTEM AND METHOD

CROSS-REFERENCE TO RELATED APPLICATIONS

This Utility Patent Application is a continuation application of U.S. application Ser. No. 12/269,168, filed Nov. 12, 2008, which is incorporated herein by reference.

BACKGROUND

The resistance of sensors based on Magnetoresistance (MR), such as Giant Magnetoresistance (GMR) or Tunnel Magnetoresistance (TMR) sensors, varies when an external magnetic field is applied to the sensor device. Magnetoresistance angle sensors are widely used in non-contact angular position sensors in harsh environments like in automobiles or industry. In general, these sensors are relatively insensitive to wear and contamination.

Magnetoresistance "spin valve" sensors typically have two magnetic layers separated by a non-magnetic layer. One of the two magnetic layers is pinned so that it has a fixed orientation in a reference direction, while the other layer is a free layer that changes orientation in response to an external magnetic field.

GMR angle sensors, for example, use bridge configurations with one resistor that reduces its resistance and another than increases its resistance when a certain physical magnitude is applied. For GMR spin-valve sensors, this can be accomplished by using GMR sensor resistors for the legs of the bridge that are magnetized in two different reference magnetization directions. To fix the reference magnetization direction, the structure is heated, an external magnetic field is applied then the structure is cooled to fix the magnetization direction.

For monolithically integrated sensors requiring multiple magnetization directions, this process must be repeated for each magnetization direction. To prevent over-writing the previously fixed magnetizations, typically a localized magnetization process is applied, such as by a local heating (for example, by monolithically integrated heating stripes or a laser spot) within an external magnetic field then cooling to fix the magnetization direction. This process has to be conducted for each magnetization direction, which adds complexity and cost to the manufacturing process.

SUMMARY

Embodiments of a sensor system and production method are disclosed. In some embodiments, a method of production includes forming first and second structures of the magnetoresistive system, heating the first and second structures, applying a magnetic field in a reference direction to the first and second structures, and cooling the first and second structures to fix a reference magnetization in the first and second structures in the reference direction. The first and second structures are heated to near or above a blocking temperature, whereby the shape anisotropy of the first structure forces the reference magnetization in the first structure to rotate into a first new orientation and the shape anisotropy of the second structure forces the reference magnetization in the second structure to rotate into a second new orientation whereby the reference magnetization in the first structure and the reference magnetization in the second structure rotate in opposite directions. The rotated reference magnetizations of the first and second structures are pinned in the respective new orientation.

In other embodiments, a sensor system includes a movable magnet having an axis of rotation, a first magnetoresistive sensor resistor situated under the axis of rotation, the first magnetoresistive sensor resistor including a pinned magnetic layer having a fixed orientation in a reference magnetization direction, and being configured such that the resistance of the first sensor resistor changes in response to an angle defined between the reference magnetization direction and a magnetic field. A plurality of second magnetoresistive sensor resistors surround the first magnetoresistive sensor resistor in inhomogeneous portions of the magnetic field, and are configured to provide a differential signal, with each of the second magnetoresistive sensor resistors including a pinned magnetic layer having a fixed orientation in the reference magnetization direction.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
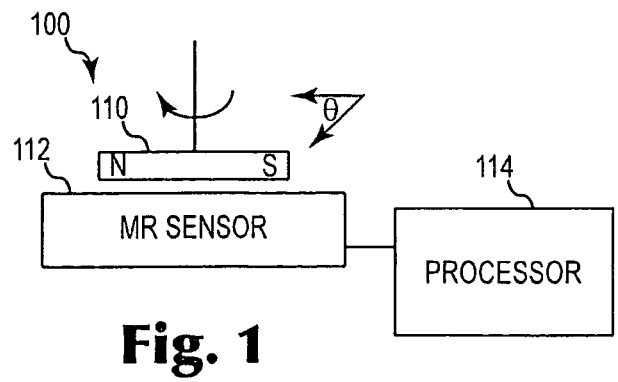
FIG. 1 conceptually illustrates an embodiment of a sensor system for measuring angular position.

FIG. 1 illustrates an embodiment of a sensor system 100 for measuring angular position. The system 100 includes a sensor 112 made up of a plurality of magnetoresistance (for example, GMR) sensor resistors. A movable magnet 110 is situated adjacent the sensor 112. The magnet 110 may be fastened to a rotatable shaft, for example. The magnet 110 establishes a magnetic field, so that when the magnet 110 rotates, the moving magnetic field causes the resistance of the sensor resistors of the sensor 112 to vary. The changing resistance is used to determine the angular position of the magnet 110, and thus the position of the shaft or other rotating device to which the magnet is attached. In the illustrated embodiment, the output of the sensor 112 is provided to a processor 114 that is programmed to determine the angular position of the rotatable magnet 110 based on the varying resistances.

In typical known sensors, the sensor resistors are configured in two bridges, one with magnetization in an x direction and one with magnetization in a y direction. The x bridge provides a signal proportional to the cosine of the angle between the direction of the magnetic field of the magnet 110 and a reference magnetization direction, and the y senor provides a sine signal proportional to the same angle. Using both signals, the angle measurement is unambiguous. Further, the sensor resistors diagonally situated in each bridge are magnetized counter-directional in order to achieve the maximum sensitivity. Thus, known sensors typically require four different magnetization directions.

Figure 2:
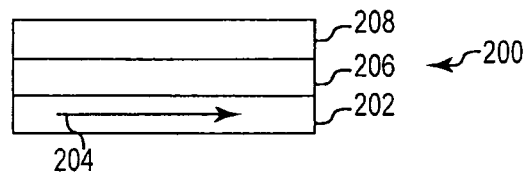
FIG. 2 conceptually illustrates an example of a magnetoresistive (MR) sensor resistor.
Figure 3A:
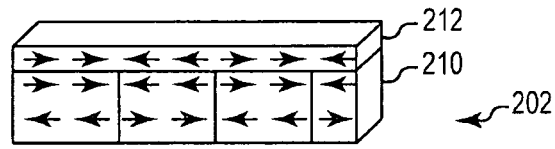
FIG. 3 illustrates a process for pinning a reference magnetization direction for an MR sensor resistor.

FIG. 2 illustrates an example of an MR sensor resistor 200 included in the sensor 112. Each of the sensor resistors 200 of the sensor 112 has a pinned magnetic layer 202 that has a fixed orientation in a reference magnetization direction 204. A nonmagnetic spacer layer 206 separates a free magnetic layer 208 and the pinned layer 202. FIG. 3 illustrates a process for pinning the reference magnetization direction 204. In the illustrated embodiment, the pinned layer 202 includes an antiferromagnetic layer 210 and a ferromagnetic layer 212. In some embodiments, the pinned layer 202 further includes a spacer layer and a reference layer. In FIG. 3a, there is no specific magnetization of the ferromagnetic layer 212.

Figure 3B:
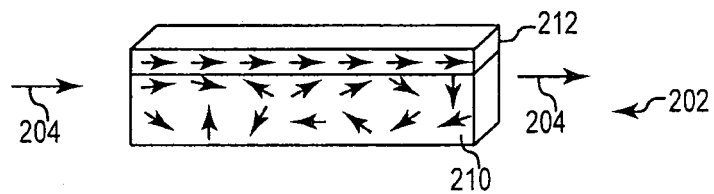
Figure 3C:
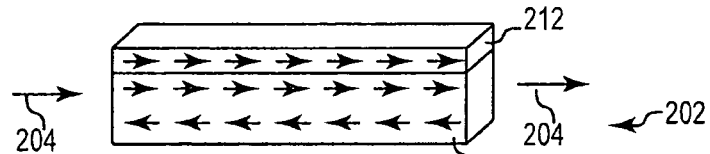
Figure 3D:
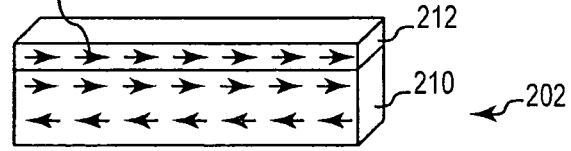

In general, the sensor resistor structures are formed on a common substrate and the magnetization is accomplished by applying an external magnetic field in the desired direction, heating the sensor element to be magnetized in this direction and cooling it. In FIG. 3b, heat is applied to the structure and a magnetic field is applied in the reference direction 204. In some embodiments, the antiferromagnetic layer 210 is formed from platinum manganese (PtMn) and is heated to a temperature between about 300-400° C., for example. In FIG. 3c, the structure is cooled such that the exchange bias aligns the surface of the antiferromagnetic layer 212, resulting in pinning the ferromagnetic layer 212 in the reference direction 204 as illustrated in FIG. 3d.

For sensor systems that require different magnetization directions for the individual sensor resistors, a separate heating process is required for pinning each magnetization direction. Moreover, the elements have to be magnetized without heating elements that have been previously magnetized, as this would overwrite the magnetization direction. Therefore, the magnetization direction is typically set using local heating in combination with a local/global magnetic field. In accordance with aspects of the present disclosure, embodiments are disclosed that require a single heating process to set the reference magnetization direction for all sensor resistors on a common substrate of a MR sensor system.

FIG. 4 illustrates an embodiment of a sensor system 300 that uses a plurality of MR sensor resistors magnetized in the same reference direction. The sensor system 300 includes a first MR sensor resistor 301 that has a pinned magnetic layer with a fixed orientation in a reference magnetization direction 204 as described above. The first sensor resistor 301 is situated adjacent a rotatable magnet 110 in a homogenous portion of the magnetic field established by the magnet 110. In other words, the first sensor resistor 301 is positioned in a location where the magnetic field lines 312 are relatively straight and extend in the same direction.

In this position, the resistance of the first sensor resistor 301 changes in response to the magnetic field established by the magnet 110. The resistance varies between a minimum and a maximum depending on the angle between the reference magnetization direction 204 and the magnetic field, following a sine function.

The group of second sensor resistors 302 are configured to provide a differential signal. Each of the second sensor resistors 302 also has a pinned magnetic layer with a fixed orientation in the same reference direction 204. Thus, the reference magnetization of all of the resistors 301, 302 can be set using a single heating process.

The second resistors 302 are situated in a region 314 of the magnetic field that is inhomogeneous. The locations of those resistors are chosen in a way that the difference has minima and maxima in angle positions that are 90° phase shifted versus the sine of the single first resistor 301. Generally, the resistance of the second resistors 302 does not follow a sine function, however both signals together deliver unambiguous information about the angle between the axis of the magnet 110 and the magnetization direction 204 of the resistors 301, 302.

In the embodiment illustrated in FIG. 4, the first sensor resistor 301 is situated under the rotation axis of the magnet 110. The second sensor resistors include four resistors 302a, 302b, 302c, 302d generally surrounding the first sensor resistor 301 and positioned in an inhomogeneous portion of the magnetic field—the portion under the stray magnetic field 314 where the magnetic field lines are curved.

Figure 4A:
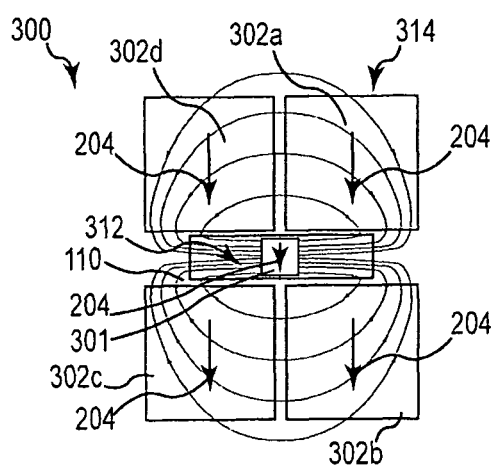
FIG. 4 illustrates an embodiment of an MR sensor system using a rectangular magnet.

In general, for an MR sensor a magnetic field in direction of the reference magnetization lowers the resistance of the MR sensor resistor, and a field in opposite direction increases it. In FIG. 4a, the long axis of the magnet 110 is oriented perpendicular to the reference direction 204. In this position, the stray magnetic field lines 314 are oriented generally opposite the reference direction 204 for the first and third sensor resistors 302a and 302c and therefore increase the resistance of these sensor resistors. For the second and fourth sensor resistors 302b and 302d, the stray field lines 314 are generally oriented in the same direction as the reference direction 204, and thus, the resistance is decreased.

Figure 4B:
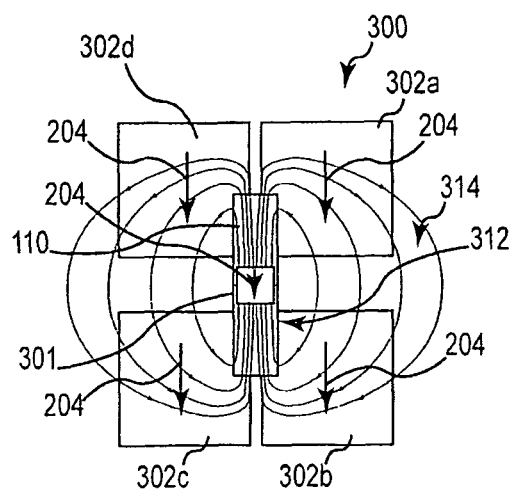
Figure 4C:
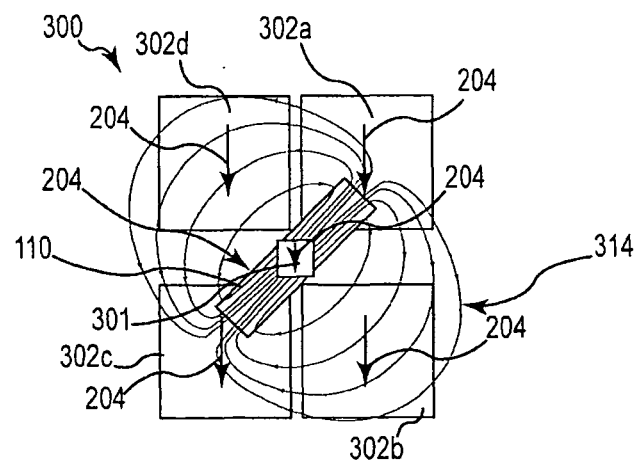

In FIG. 4b, the magnet 110 has rotated 90° such that it is oriented parallel with the reference direction 204 of the sensor resistors 301, 302. In this position, the stray magnetic field lines 314 are generally oriented in the reference direction 204, thus decreasing the resistance of all of the second sensor resistors 302a, 302b, 302c, 302d. FIG. 4c illustrates the system 300 with the magnet 110 at about a 45° angle relative to the reference direction 2004. For the first and third sensor resistors 302a, 302c of the second resistor group, the stray magnetic field lines 314 have a negligible effect on the resistance of these sensor resistors 302a, 302c because the stray field lines 314 extend in both directions. In the region of the second and fourth sensor resistors 302b, 302d, the field lines 314 extend generally in the same direction as the reference direction 204 and thus, decrease the resistance of the second and fourth sensor resistors 302b,302d.

Figure 5A:
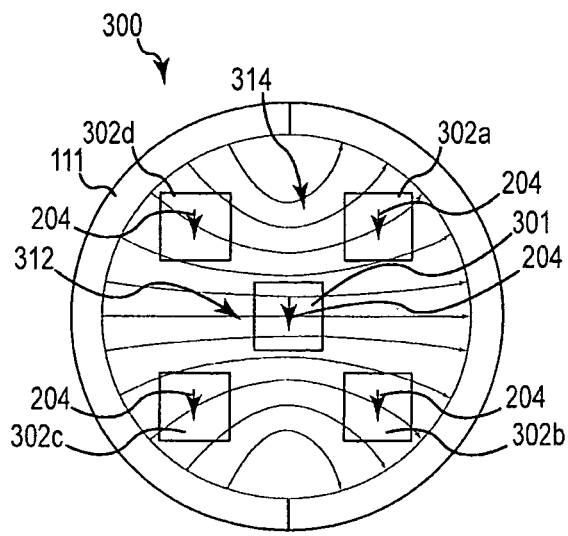
FIG. 5 illustrates an embodiment of an MR sensor system using a ring magnet.

FIG. 5 illustrates an embodiment of a sensor system 300 where a ring magnet 111 is used rather than the rectangular magnet 110 illustrated in FIG. 4. In FIG. 5a, the homogeneous field lines 312 established by the ring magnet 111 are oriented perpendicular to the reference direction 204. Accordingly, the stray magnetic field lines 114 are oriented generally opposite the reference direction 204 for the first and third sensor resistors 302a and 302c and therefore increase the resistance of these sensor resistors. For the second and fourth sensor resistors 302b and 302d, the stray field lines are generally oriented in the same direction as the reference direction 204, and thus, the resistance is decreased.

Figure 5B:
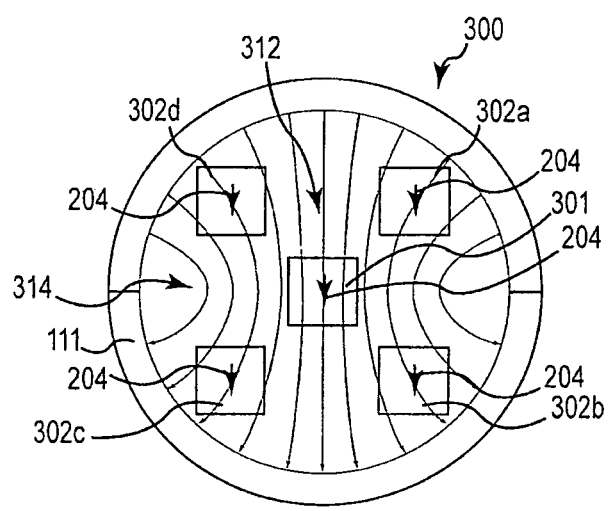

In FIG. 5b, the ring magnet 111 is rotated 90° such that the field lines 312 are parallel with the reference direction 204 of the sensor resistors 301, 302. In this position, the stray magnetic field lines 314 are generally oriented in the reference direction 204, thus decreasing the resistance of all of the second sensor resistors 302a,302b,302c,302d.

Figure 6:
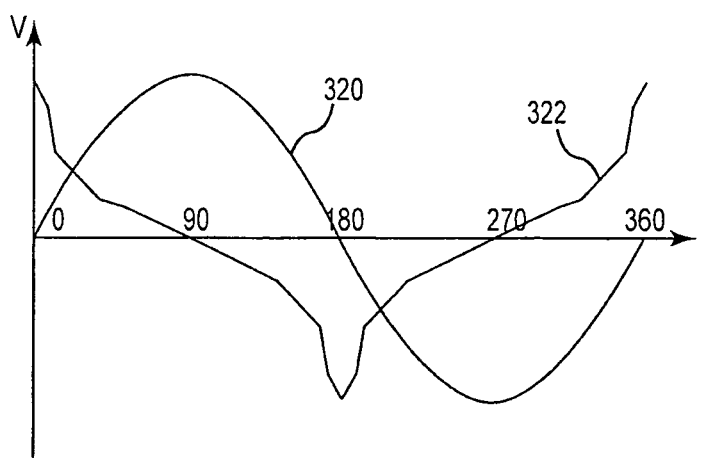
FIG. 6 illustrates an example of signals output by a system according to FIG. 4 or 5.

FIG. 6 illustrates an example of signals from the sensor resistors 301, 302. As noted above, the first sensor resistor 301 outputs a sinusoidal signal 320 in response to the rotating magnet. The second sensor resistors 302 are configured to provide differential signals, where the curve 322 of the second resistors 302a, 302b, 302c, 302d is calculated by combining the resistances according to (302a-302b)+(302c-302d), for example. The functions (302d-302b) and (302a-302c) should always be 0, which can be used for adjustment of the magnet position and for self testing of misalignment or asymmetrical damage of the sensors.

In some embodiments, the angle is determined using a look up table that correlates the signals of the first and second resistors 301, 302 with angular positions. In other embodiments, the arctan of the quotient of both signals is calculated. The difference of the second sensor resistor group 302 is not an exact cosine function. Rather, the result is a disturbed angle and is linearized. In some embodiments, the arcsin of the first sensor resistor 301 is calculated and the correct region on the angle axis is identified based on the sign of the differential signal from the second resistors 302.

Figure 7:
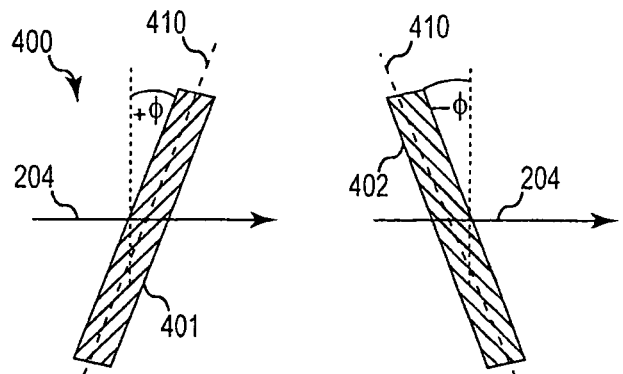
FIG. 7 illustrates another embodiment of an MR sensor system.

FIG. 7 illustrates another embodiment of a sensor system 400. This embodiment makes use of the shape anisotropy in narrow MR stripe structures (for example, less than 5 μm in width). The sensor system includes first and second MR sensor resistors 401, 402. The first and second sensor resistors 401,402 each have a pinned reference magnetization direction that is set, for example, with a heating process described above. As with the earlier-disclosed embodiments, the reference magnetization direction of the first and second sensor resistors 401,402 is pinned using a single heating process.

With known MR sensors, the reference magnetization direction is typically perpendicular to the stripe length axis. In the illustrated embodiment, the sensor resistors 401,402 each have a length axis 410. The first sensor resistor 401 has its length axis 410 oriented by 90°+an angle Φ, where Φ<90°, relative to the axis of the reference magnetization direction 204. The second sensor resistor 402 has its length axis 410 oriented by 90°−Φ relative to the reference magnetization axis 204. In some embodiments, Φ is between 5° and 85°. In some embodiments, the value of the angle Φ is not exactly the same for the first and second resistors 401,402 due to manufacturing tolerances, etc. Electrically/magnetically a small difference (for example, +/−4°) between the angle Φ in the first and second resistors does not make a significant difference.

Figure 8:
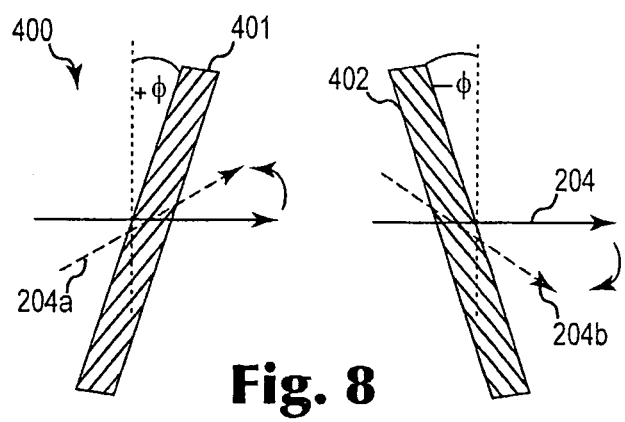
FIG. 8 illustrates the system of FIG. 7 with reference magnetization directions rotated.

An asymmetry between the first and second sensor resistors 401,402 is thus introduced. Assuming the same initial reference magnetization direction (or axis) 204, the shape anisotropy forces the reference magnetization for one of the sensor resistors into one direction, and into the opposite direction for the other sensor resistor. When the sensor 400 is heated near or above the temperature required to pin the reference magnetization direction, or the "blocking temperature" (about 300-400° C. for PtMn as the natural antiferromagnet), the reference magnetization is almost free to be rotated along its anisotropy force gradient—in opposite directions for the first and second sensor resistors 401,402 as illustrated in FIG. 8.

After cooling down, the new orientation of the reference magnetizations 204a, 204b is pinned. As a result, two sensor resistors are formed which exhibit at least components that are aligned in an anti-parallel manner to each other. Therefore, by a combination of the two resistors in a Wheatstone bridge configuration, a differential output signal is obtained.

Figure 9:
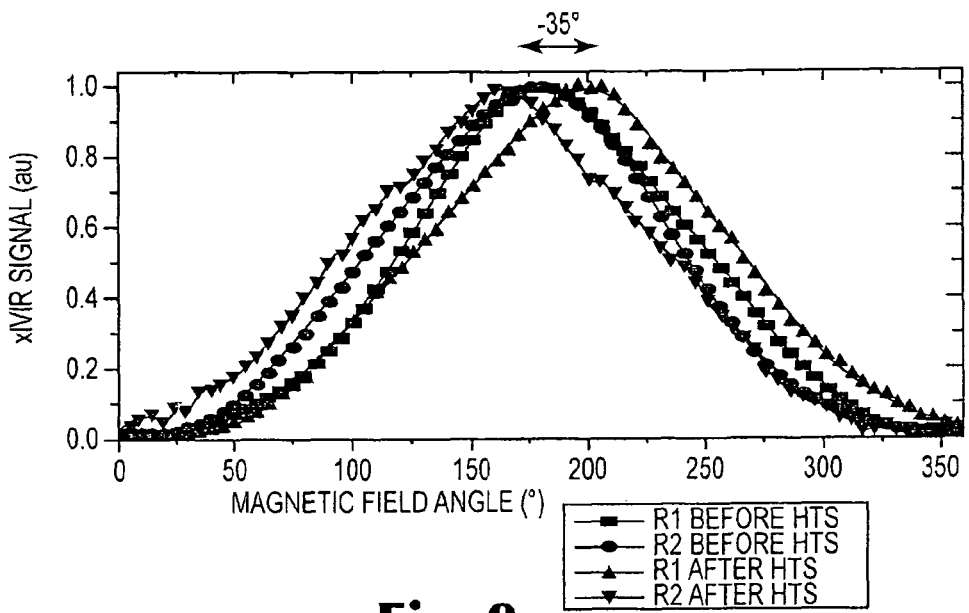
FIG. 9 illustrates an example of signals output by systems according to FIGS. 7 and 8.

FIG. 9 is a chart illustrating experimental data with first and second curves 421,422 plotting the output signals of the sensor resistors of a non-optimized MR sensor with first and second sensor resistors having a tilt angle of +/−45°. The curves 421,422 match for much of range of magnetic field angles. After applying 375° C. for one hour, the rotated reference magnetization directions of the first and second sensor resistors is pinned, such as with the embodiment illustrated in FIG. 8. As a result, an angle of about 35° between the reference magnetization directions of the first and second sensor resistors is obtained, resulting in a variation between the curves 431,432 which can be used to provide a differential output signal used to identify the angular position of the rotating magnet.

Figure 10:
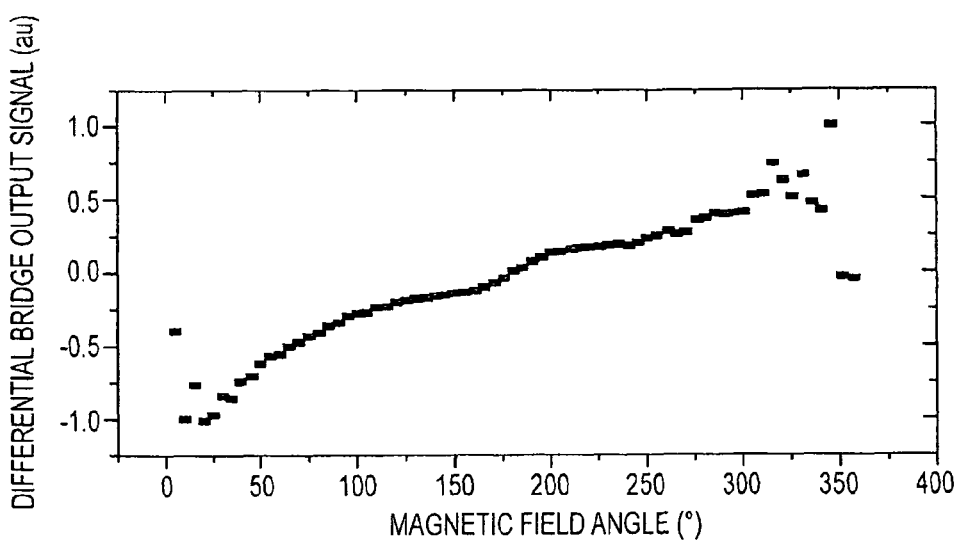
FIG. 10 illustrates differential output signals according to the system according to FIG. 8.

Assuming a Wheatstone bridge configuration with the first and second resistors 401,402, a differential output signal is generated by a rotating magnetic field as illustrated in FIG. 10. Such a signal can be used to implement a sensor for detecting a magnetic field direction within a restricted angular range (less than 180° in some embodiments) and with low accuracy requirements. Furthermore, magnetic field strength can be detected, suitable for use as a proximity switch, for example.

Figure 11:
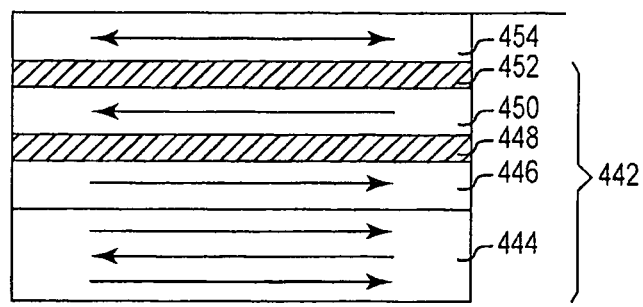
FIG. 11 conceptually illustrates an embodiment of an MR resistor stack.

FIG. 11 schematically illustrates MR resistor stack 440 suitable for use in the embodiment illustrated in FIGS. 8 and 9. It has an antiferromagnet layer 442 that includes a natural antiferromagnet layer 444 formed from IrMn or PtMn, for example. A ferromagnetic layer, or pinned layer 446 is situated over the natural antiferromagnet 444 and by process a very stable magnetization direction. A non-magnetic spacer layer 448 separates the ferromagnet layer 446 from an antiferromagnetically coupled reference layer 450. The antiferromagnetic coupling is managed by the thickness of the spacer layer 448. The ferromagnetic layer 446 and the reference layer 450 together form an artificial antiferromagnet 442 that enhances the stability against external magnetic fields. Another spacer layer 452 separates the reference layer 450 from a free layer 454. The variation of the magnetization angles between the free layer 454 and the reference layer 450 provides the spin valve effect.

For proximity switch implementations, a certain coupling between the free layer 454 and the reference layer 450 (either ferromagnetic or anti-ferromagnetic) is necessary in order to provide a reset force for the free layer magnetization. Such a coupling force can be adjusted by the thickness of the non-magnetic spacer layer 452. In some embodiments, the reference layer 450 has a thickness between about 0.5 nm and 10 nm, and the pinned layer 446 has a thickness between about 0.5 nm and 10 nm.

The disclosed embodiments allow the formation of a MR sensor system using a single heating process such as that disclosed and described in conjunction with FIG. 3 to pin the reference direction of a plurality of sensor resistor structures. Generally, the plurality of magnetoresistive sensor resistor structures are formed on a substrate, configured as disclosed in the embodiments described above, for example. The resistor structures are heated (about 300-400° C. for PtMn) and a magnetic field is applied in a reference direction. A furnace or a rapid thermal anneal process is used for heat application in some embodiments. The structure is then cooled to fix the reference magnetization direction for each of the sensor resistor structures. Thus, with a single heating process, the resistor structures can be configured to output a differential signal that varies in response to an external magnetic field.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a magnetoresistive system, the method comprising:
    forming first and second structures of the magnetoresistive system;
    heating the first and second structures;
    applying a magnetic field in a reference direction to the first and second structures;
    cooling the first and second structures to fix a reference magnetization in the first and second structures in the reference direction;
    heating the first and second structures near or above a blocking temperature, whereby the shape anisotropy of the first structure forces the reference magnetization in the first structure to rotate into a first new orientation and the shape anisotropy of the second structure forces the reference magnetization in the second structure to rotate into a second new orientation whereby the reference magnetization in the first structure and the reference magnetization in the second structure rotate in opposite directions; and
    pinning the rotated reference magnetizations of the first and second structures in the respective new orientation.

2. The method of claim 1, wherein each of the first structure and the second structure is formed as stripe, and wherein the first and second structures each have respective first and second length axes in different directions.

3. The method of claim 2, wherein:
    the first length axis is oriented by 90 plus a first angle, where the first angle is <90° relative to a reference magnetization axis; and
    the second length axis is oriented by 90 minus a second angle relative to the reference magnetization axis, where the second angle is about equal to the first angle.

4. The method of claim 3, wherein the first angle is between 5° and 85°.

5. A method for producing a magnetoresistive system, the method comprising:
    forming first and second structures of the magnetoresistive system;
    heating the first and second structures;
    applying a magnetic field in a reference direction to the first and second structures
    cooling the first and second structures to fix a reference magnetization in the first and second structures in the reference direction;
    heating the first and second structures near or above a blocking temperature, whereby the shape anisotropy of the first structure forces the reference magnetization in the first structure to rotate into a first new orientation and the shape anisotropy of the second structure forces the reference magnetization in the second structure to rotate into a second new orientation whereby the reference magnetization in the first structure and the reference magnetization in the second structure rotate in opposite directions; and
    pinning the rotated reference magnetizations of the first and second structures in the respective new orientation, wherein the first and second magnetoresistive structures each include:
        an antiferro magnet layer;
        a pinned magnetic layer situated on the antiferro magnet layer;
        a first non-magnetic spacer layer situated on the pinned magnetic layer opposite the antiferro magnet layer;
        a reference magnetic layer situated on the first spacer layer opposite the pinned magnetic layer, wherein the reference magnetic layer defines a reference magnetization axis;
        a second non-magnetic spacer layer situated on the reference magnetic layer opposite the first spacer layer; and
        a free magnetic layer situated on the second spacer layer opposite the reference magnetic layer, wherein the free magnetic layer changes orientation in response to an external magnetic field.

6. The method of claim 5, wherein the reference layer has a thickness between 0.5 nm and 10 nm.

7. The method of claim 5, wherein the pinned layer has a thickness between 0.5 nm and 10 nm.

8. A sensor system, comprising:
    a movable magnet having an axis of rotation;
    a first magnetoresistive sensor resistor situated under the axis of rotation, the first magnetoresistive sensor resistor including a pinned magnetic layer having a fixed orientation in a reference magnetization direction, and being configured such that the resistance of the first sensor resistor changes in response to an angle defined between the reference magnetization direction and a magnetic field;
    a plurality of second magnetoresistive sensor resistors surrounding the first magnetoresistive sensor resistor in inhomogeneous portions of the magnetic field, the second magnetoresistive sensor resistors configured to provide a differential signal, each including a pinned magnetic layer having a fixed orientation in the reference magnetization direction.

9. The sensor system of claim 8, wherein the movable magnet is a rectangular magnet.

10. The sensor system of claim 8, wherein the movable magnet is a ring magnet.

11. The sensor system of claim 8, wherein the plurality of second magnetoresistive sensor resistors includes four resistors.

12. The sensor system of claim 8, wherein the first and second magnetoresistive sensor resistors are situated on a common substrate.

\* \* \* \* \*